(12) United States Patent  (10) Patent No.: US 9,170,294 B2
Lenzie  (45) Date of Patent: Oct. 27, 2015

(54) TESTING APPARATUS FOR AN ELECTRICAL OUTLET

(71) Applicant: ECHOSTAR TECHNOLOGIES L.L.C., Englewood, CO (US)

(72) Inventor: Kirk Lenzie, Aurora, CO (US)

(73) Assignee: EchoStar Technologies L.L.C., Englewood, CO (US)

( * ) Notice: Subject to any disclaimer, the term of this patent is extended or adjusted under 35 U.S.C. 154(b) by 225 days.

(21) Appl. No.: 13/924,344

(22) Filed: Jun. 21, 2013

(65) Prior Publication Data

US 2014/0375328 A1     Dec. 25, 2014

(51) Int. Cl.
*G01R 31/04*     (2006.01)

(52) U.S. Cl.
CPC ..................... *G01R 31/041* (2013.01)

(58) Field of Classification Search
CPC ................................................ G01R 31/041
USPC ............................................ 324/508
See application file for complete search history.

(56) References Cited

U.S. PATENT DOCUMENTS

| | | | |
|---|---|---|---|
| 3,176,219 A * | 3/1965 | Behr | 324/508 |
| 6,731,217 B1 * | 5/2004 | Warner | 340/650 |
| 6,734,680 B1 * | 5/2004 | Conard | 324/509 |
| 2004/0169517 A1 * | 9/2004 | Vang | 324/522 |
| 2005/0212526 A1 * | 9/2005 | Blades | 324/543 |
| 2009/0160663 A1 * | 6/2009 | Silverman et al. | 340/654 |
| 2009/0212785 A1 * | 8/2009 | Radle et al. | 324/508 |

OTHER PUBLICATIONS

Wikipedia "Receptacle Tester" modified on May 28, 2013; retrieved from the Internet at https://en.wikipedia.org/wiki/Receptacle_tester, 3 pages.

* cited by examiner

*Primary Examiner* — Jeff Natalini
(74) *Attorney, Agent, or Firm* — Ingrassia Fisher & Lorenz, P.C.

(57) ABSTRACT

A testing apparatus compatible with an electrical outlet is presented here. The outlet has a line socket designated for a line voltage conductor, a neutral socket designated for a neutral voltage conductor, and a ground socket designated for a ground voltage conductor. The testing apparatus includes a housing, a plug interface having an electrically conductive ground prong configured to mate with the ground socket, a first indicator lamp having a first terminal electrically coupled to the ground prong, and an electrically conductive lead extending from the housing. The conductive lead has a proximal end electrically coupled to the second terminal of the indicator lamp, and a distal end terminated with an electrically conductive connector. The indicator lamp is activated in response to a voltage differential between the ground prong and the electrically conductive connector.

5 Claims, 4 Drawing Sheets

TESTING APPARATUS FOR AN ELECTRICAL OUTLET

TECHNICAL FIELD

Embodiments of the subject matter described herein relate generally to electrical testing and diagnostic equipment. More particularly, embodiments of the subject matter relate to an electrical outlet (receptacle) tester.

BACKGROUND

Electrical outlet and receptacle testers are compact devices that are used to test the electrical connections of an alternating current (AC) power outlet. A typical outlet tester includes electrically conductive prongs that are arranged for compatibility with the socket layout of the outlet under test. In the United States, for example, most outlet testers include three prongs for compatibility with standard three-socket AC outlets: two parallel blades (corresponding to the line and neutral sockets) and an offset prong (corresponding to the ground socket). An outlet tester is simple to use; the prongs are inserted into an electrical outlet and indicator lights are illuminated in accordance with the electrical connections of the outlet. Most modern outlet testers utilize three indicator lights, and the illumination pattern indicates whether the outlet under test is wired correctly or whether there is a wiring fault.

Conventional AC outlet testers are unable to detect an incorrectly wired outlet having both the ground and neutral terminals tied to the line wire (the "hot" wire) and having the line terminal tied the ground wire (or the neutral wire). Although this is an uncommon wiring mistake, it may appear in older homes where an original two-wire outlet has been "converted" into a modern three-wire outlet. In such a scenario, the original two wires (line and neutral) are mistakenly swapped, and the ground terminal of the three-wire outlet is tied to the same outlet terminal as the original neutral wire. Under these conditions, a conventional AC outlet tester will indicate that the outlet is properly wired.

Accordingly, it would be beneficial to have an improved AC outlet tester that does not suffer from the shortcomings and deficiencies of conventional outlet testers. Furthermore, other desirable features and characteristics will become apparent from the subsequent detailed description and the appended claims, taken in conjunction with the accompanying drawings and the foregoing technical field and background.

BRIEF SUMMARY

An embodiment of a testing apparatus is presented herein. The testing apparatus is compatible with an electrical outlet having a line socket designated for a line voltage conductor, a neutral socket designated for a neutral voltage conductor, and a ground socket designated for a ground voltage conductor. The testing apparatus includes a housing, a plug interface, a diagnostic test circuit, and an electrically conductive lead extending from the housing. The plug interface includes electrically conductive prongs protruding from the housing. The conductive prongs include a first prong configured to mate with the line socket, a second prong configured to mate with the neutral socket, and a third prong configured to mate with the ground socket. The diagnostic test circuit is electrically coupled to the plug interface. The diagnostic test circuit has a first indicator element electrically coupled to the third prong. The conductive lead has a proximal end electrically coupled to the first indicator element and a distal end terminated with an electrically conductive connector. The first indicator element is activated in response to a voltage differential between the third prong and the electrically conductive lead.

Another embodiment of a testing apparatus is also presented herein. The testing apparatus includes a housing, a plug interface, a first indicator lamp, and an electrically conductive lead extending from the housing. The plug interface has an electrically conductive ground prong configured to mate with the ground socket. The first indicator lamp has a first terminal and a second terminal, wherein the first terminal is electrically coupled to the ground prong. The electrically conductive lead has a proximal end electrically coupled to the second terminal of the indicator lamp, and a distal end terminated with an electrically conductive connector. The indicator lamp is activated in response to a voltage differential between the ground prong and the electrically conductive connector.

Yet another embodiment of a testing apparatus is provided herein. The testing apparatus includes a housing, a plug interface, four voltage controlled indicator lamps, and a grounding lead extending from the housing. The plug interface has an electrically conductive line prong extending from the housing and configured to mate with the line socket, an electrically conductive neutral prong extending from the housing and configured to mate with the neutral socket, and an electrically conductive ground prong extending from the housing and configured to mate with the ground socket. The first voltage controlled indicator lamp has a first terminal electrically coupled to the ground prong. The second voltage controlled indicator lamp has a first terminal electrically coupled to the line prong, and a second terminal electrically coupled to the ground prong. The third voltage controlled indicator lamp has a first terminal electrically coupled to the neutral prong, and a second terminal electrically coupled to the line prong. The fourth voltage controlled indicator lamp has a first terminal electrically coupled to the neutral prong, and a second terminal electrically coupled to the ground prong. The grounding lead has a proximal end electrically coupled to the second terminal of the first voltage controlled indicator lamp, and a distal end terminated with an electrically conductive connector.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

Figure 3:
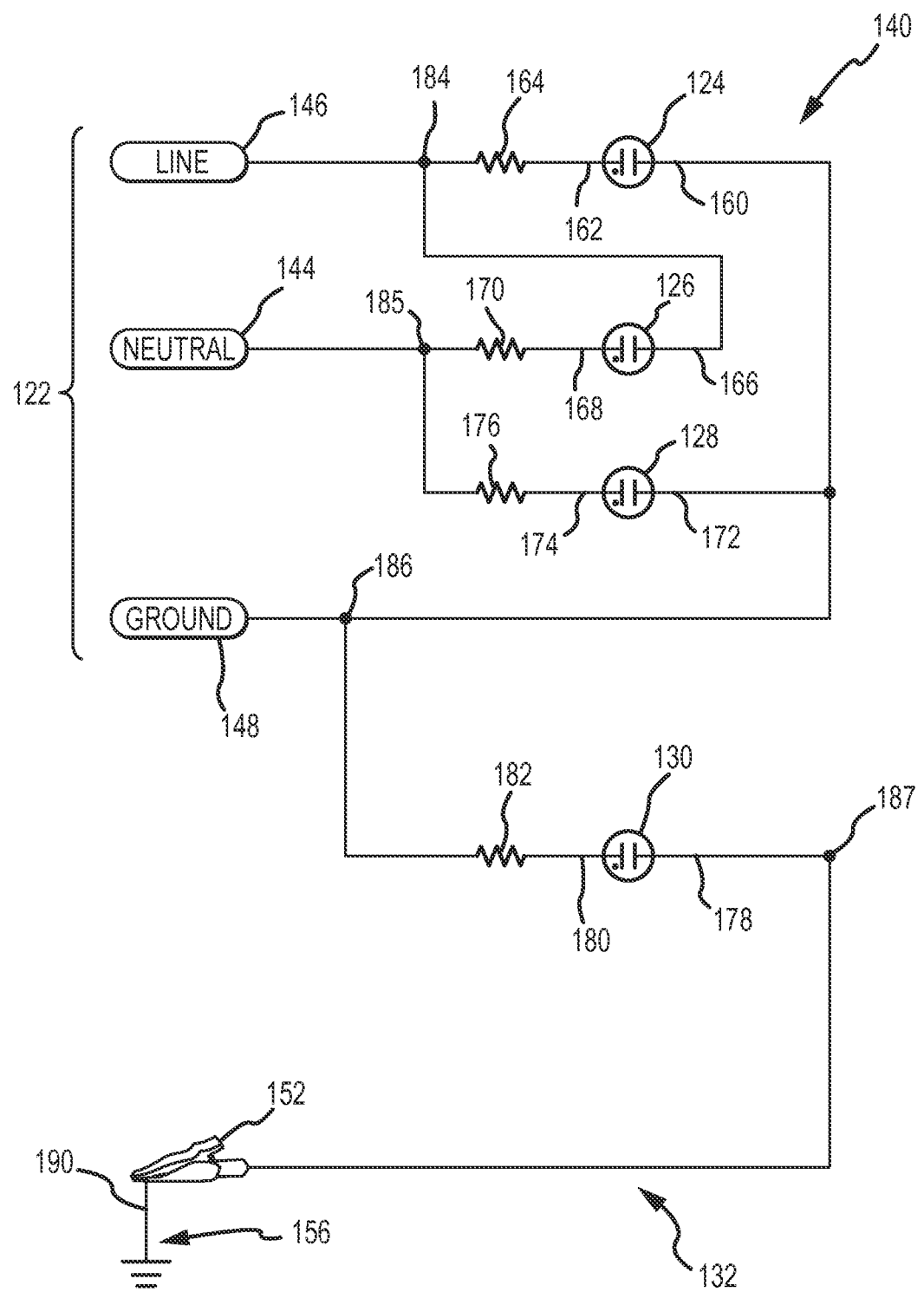
FIG. 3 is a schematic diagram that illustrates an exemplary electrical circuit suitable for use with the AC outlet tester.

The following description may refer to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically. Thus, although the schematic shown in FIG. 3 depicts one exemplary arrangement of elements, additional intervening elements, devices, features, or components may be present in an embodiment of the depicted subject matter.

Figure 1:
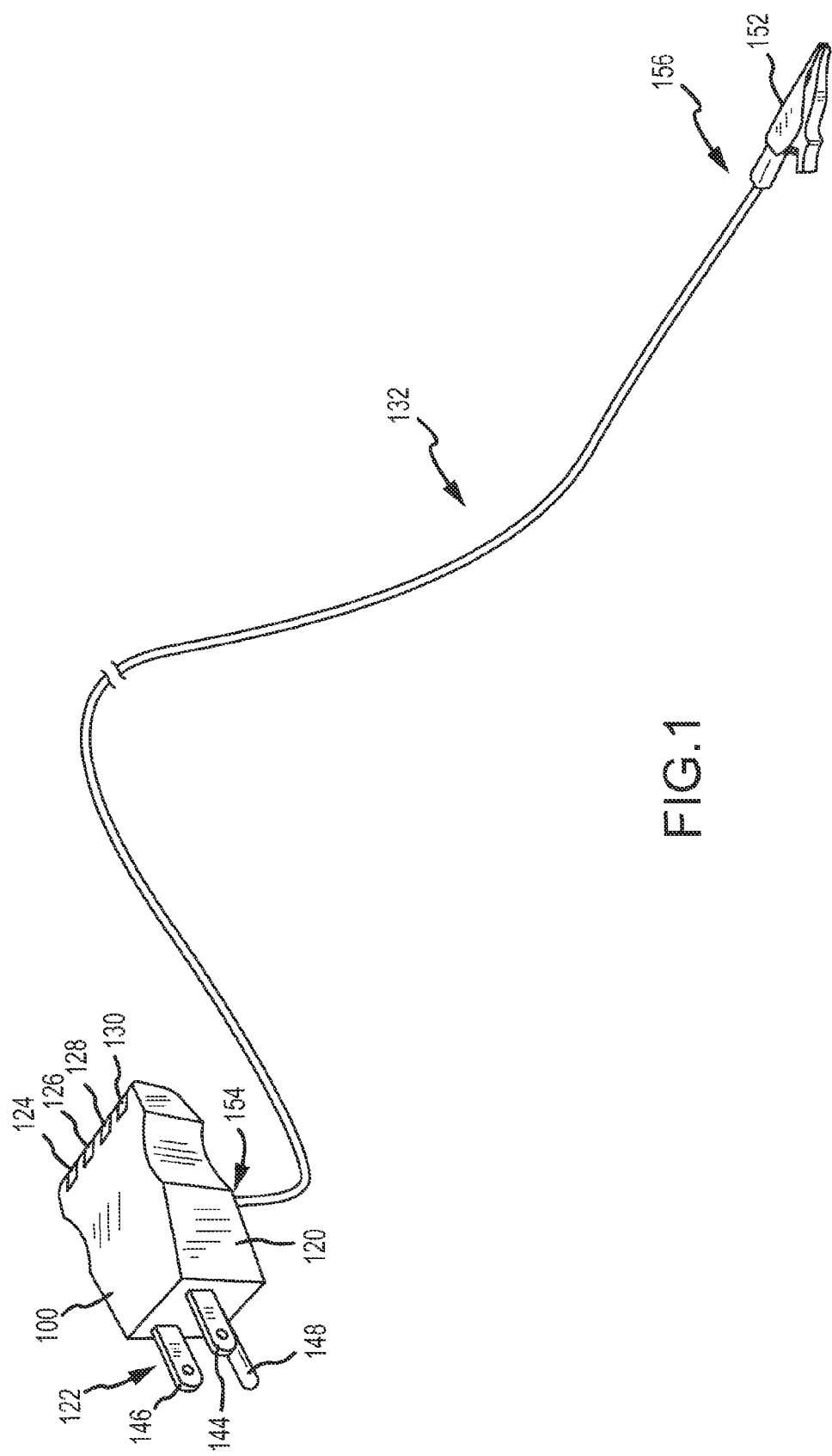
FIG. 1 is a perspective view of an exemplary embodiment of an AC outlet tester.
Figure 2:
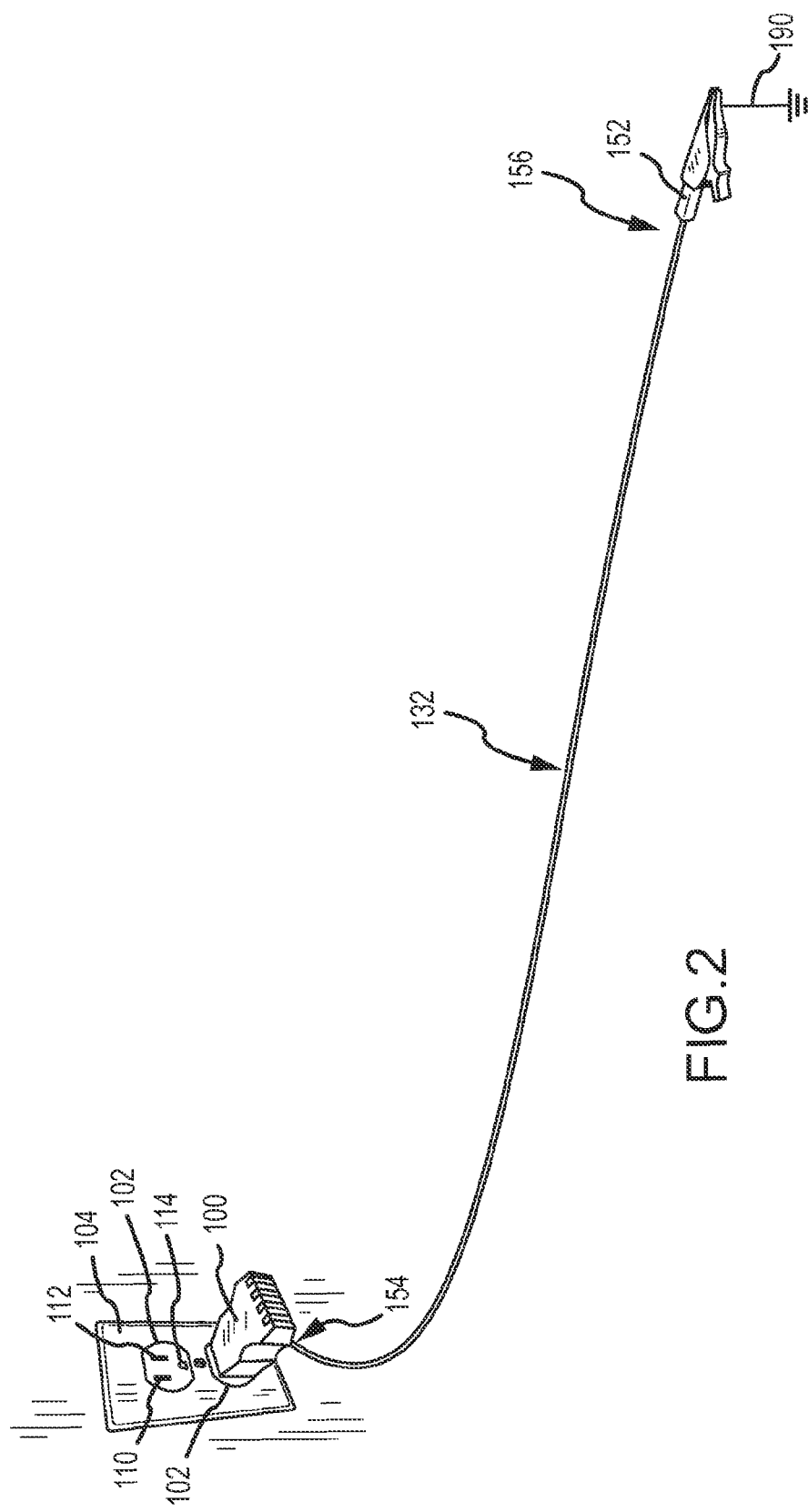
FIG. 2 is a perspective view of the AC outlet tester in a typical testing scenario.

FIG. 1 is a perspective view of an exemplary embodiment of an AC outlet tester 100 that is configured to test the electrical connections in an AC outlet. FIG. 2 is a perspective view of the tester 100 in a typical testing scenario. FIG. 2 depicts the tester 100 inserted into one outlet 102 of a dual-outlet wall panel 104. This description assumes that the tester 100 is compatible with standard outlets that are typically found in North America (e.g., NEMA 5-15 or NEMA 5-20 outlets). In this regard, the outlet 102 includes a neutral socket 110 (or slot) that is intended and designated for a neutral voltage conductor, a line socket 112 (or slot) that is intended and designated for a line voltage conductor, and a ground socket 114 that is intended and designated for a ground voltage conductor. If the internal wiring of the outlet 102 is correct, then the sockets 110, 112, 114 will be electrically coupled to their respective and designated conductors. The shape, size, configuration, and arrangement of the sockets 110, 112, 114 are standardized such that the tester 100 can mate with the outlet 102, as depicted in FIG. 2.

Referring to FIG. 1, the tester 100 generally includes, without limitation: a housing 120; a plug interface 122; four indicator elements 124, 126, 128, 130; and a lead 132 extending from the housing 120. Referring to FIG. 3, the tester 100 also includes a diagnostic test circuit 140, which may include the indicator elements 124, 126, 128, 130. The plug interface 122 and the lead 132 may also be considered to be part of the test circuit 140.

The housing 120 represents the main structure and body of the tester 100. The housing 120 may be formed from any suitable material that is an electrical insulator, e.g., plastic, hard rubber, polyurethane, or the like. As shown in FIG. 1, the plug interface 122 includes electrically conductive prongs 144, 146, 148, which protrude and extend from the housing 120 for purposes of mating with the outlet 102. Thus, the prong 144 is configured to mate with the neutral socket 110, the prong 146 is configured to mate with the line socket 112, and the prong 148 is configured to mate with the ground socket 114. When the plug interface 122 is inserted into the outlet 102, the prongs 144, 146, 148 establish electrical connections with the respective sockets 110, 112, 114.

The indicator elements 124, 126, 128, 130 may be realized as voltage controlled lamps or lights. In certain embodiments, the indicator elements 124, 126, 128 are implemented using neon lamps having predicable and relatively high turn-on voltages. For example, the indicator elements 124, 126, 128 may be selected such that they illuminate only in the presence of at least 70 volts across their terminals. For reasons that will become apparent from the following description, the indicator element 130 may be implemented using a similar type of neon lamp or, in some embodiments, the indicator element 130 may be implemented using a lamp or a light having a relatively low turn-on voltage threshold. As depicted in FIG. 1, the lens or light-emitting portion of each indicator element 124, 126, 128, 130 is external to the housing 120 for visibility.

The lead 132 extends from the housing 120 and may be of any desired length. In certain embodiments, the lead 132 is fabricated from an insulated wire or cable (e.g., an 18 gauge wire) that is terminated with an electrically conductive connector 152. The connector 152 may be realized as an alligator clip, a clamp, a fitting, or any device that can be physically and electrically coupled to an structure that serves as an AC voltage reference. As shown in FIG. 1 and FIG. 2, the proximal end 154 of the lead 132 is secured to the housing 120, and the distal end 156 of the lead 132 is terminated with the connector 152. In practice, the proximal end 154 of the lead 132 is electrically coupled to the indicator element 130 (see FIG. 3). In some embodiments, the lead 132 is integrally formed with the housing 120 and is intended to be a fixed and permanent component of the tester 100. In alternative embodiments, the lead 132 is suitably configured as a removable component. In this regard, the proximal end 154 of the lead 132 may be terminated with a plug or connector that facilitates removable coupling (physical and electrical) with the housing 120 and the test circuit 140.

Referring to FIG. 3, the test circuit 140 includes (or is electrically coupled to) the plug interface 122, which enables the test circuit 140 to selectively activate the indicator elements 124, 126, 128, 130 in response to the AC voltages associated with the conductive prongs 144, 146, 148. The indicator element 124 has one terminal 160 electrically coupled to the ground prong 148, and another terminal 162 electrically coupled to the line prong 146. Thus, the indicator element 124 is electrically coupled between the line prong 146 and the ground prong 148. The illustrated embodiment also includes a resistor 164 coupled in series between the line prong 146 and the terminal 162 of the indicator element 124. The resistor 164 is utilized to control the electrical current through the indicator element 124. In this regard, prior to activation, the indicator element 124 acts as a high impedance component such that very little current flows through it. After the indicator element 124 illuminates, however, it acts as a relatively low impedance component. Accordingly, the resistor 164 is placed in series with the indicator element to limit the current that flows while the indicator element 124 is illuminated. It should be appreciated that the value of the resistor 164 will depend on the particular circuit layout and the electrical and operating characteristics of the indicator element 124. In certain implementations, the resistor 164 may be in the range of about 10 to 100 Ohms. In practice, however, the actual value of the resistor 164 may be outside of this range. Although not always required, the four indicator elements will typically be selected to have the same rating and electrical characteristics. In such embodiments, the four resistors will usually have the same value.

The indicator element 126 has one terminal 166 electrically coupled to the line prong 146, and another terminal 168 electrically coupled to the neutral prong 144. Thus, the indicator element 126 is electrically coupled between the line prong 146 and the neutral prong 144. The illustrated embodiment also includes a resistor 170 coupled in series between the neutral prong 144 and the terminal 168 of the indicator element 126. The resistor 170 may be utilized to regulate the current that flows through the indicator element 126 (as mentioned above).

The indicator element 128 has one terminal 172 electrically coupled to the ground prong 148, and another terminal 174 electrically coupled to the neutral prong 144. Thus, the indicator element 128 is electrically coupled between the neutral prong 144 and the ground prong 148. The illustrated embodiment also includes a resistor 176 coupled in series between the neutral prong 144 and the terminal 174 of the indicator element 128. The resistor 176 may be utilized to control the amount of current that flows through the indicator element 128 (in the manner described above).

The indicator element 130 has one terminal 178 electrically coupled to the conductive grounding lead 132, and another terminal 180 electrically coupled to the ground prong 148. Thus, the indicator element 130 is electrically coupled in series between the ground prong 148 and the lead 132. The illustrated embodiment also includes a resistor 182 coupled in series between the ground prong 148 and the terminal 180 of the indicator element 130. The resistor 182 may be utilized to regulate the current that flows through the indicator element 130 (as described above).

As depicted in FIG. 3, the exemplary embodiment of the test circuit 140 is arranged such that the line prong 146, the terminal 166 of the indicator element 126, and one terminal of the resistor 164 correspond to an electrical node 184. Moreover, the neutral prong 144, one terminal of the resistor 170, and one terminal of the resistor 176 correspond to an electrical node 185. Moreover, the ground prong 148, the terminal 160 of the indicator element 124, the terminal 172 of the indicator element 128, and one terminal of the resistor 182 correspond to an electrical node 186. Furthermore, the terminal 178 of the indicator element 130, the conductive lead 132, and the connector 152 may be considered to be an electrical node 187.

Each of the voltage controlled indicator elements 124, 126, 128, 130 is activated (i.e., illuminates) in response to a voltage differential between its two terminals, wherein the voltage differential must exceed the minimum threshold of that particular indicator element. As mentioned above, the threshold voltage may be, for example, 60-80 volts AC, such that the indicator elements 124, 126, 128, 130 remain deactivated (not illuminated) at relatively low voltage levels. Accordingly, the indicator element 124 is activated in response to the presence of at least a minimum voltage differential between the line prong 146 and the ground prong 148, the indicator element 126 is activated in response to the presence of at least a minimum voltage differential between the line prong 146 and the neutral prong 144, and the indicator element 128 is activated in response to the presence of at least a minimum voltage differential between the neutral prong 144 and the ground prong 148. The indicator element 130, however, is activated in response to the presence of at least a minimum voltage differential between the ground prong 148 and the lead 132 (which will have the same electrical potential as the connector 152 for purposes of this description).

FIG. 3 depicts one exemplary circuit 140 that could be utilized to support the desired features and functionality described here. It should be appreciated that other electrical circuits having different layouts and electrical components could be utilized in lieu of the particular circuit 140 shown here, as long as the intended functionality remains intact. The particular electrical schematic shown in FIG. 3 is simply provided as one suitable implementation, and the schematic is not intended to limit or otherwise restrict the scope of the subject matter presented herein.

Referring again to FIG. 2, the tester 100 can be used in the following manner to test the outlet 102. The plug interface 122 is inserted into the outlet 102, and the lead 132 is extended such that the connector 152 can be electrically coupled to a reliable ground point 190, such as an earth ground. To ensure that the ground point 190 is actually the ground reference that is used throughout the premises, the connector 152 can be coupled to a known ground terminal, which may be located at the main circuit breaker panel. Alternatively, the connector 152 could be coupled to an earth ground stake, to an earth grounded water pipe, or the like. Although not shown in the figures, the tester 100 may be provided with a spool or a winding mechanism to accommodate a lead 132 having a relatively long length (e.g., twenty or fifty feet).

Notably, the tester 100 is passive in that it operates using the AC power (or lack thereof) that is provided at the outlet 102. Thus, after the plug interface 122 and connector 152 are installed as depicted in FIG. 2, the technician can view the illuminated indicator elements (if any) to determine whether or not the outlet 102 under test is properly wired. In this regard, FIG. 4 is a diagram that illustrates exemplary illumination patterns that could be generated during use of the tester 100.

Figure 4:
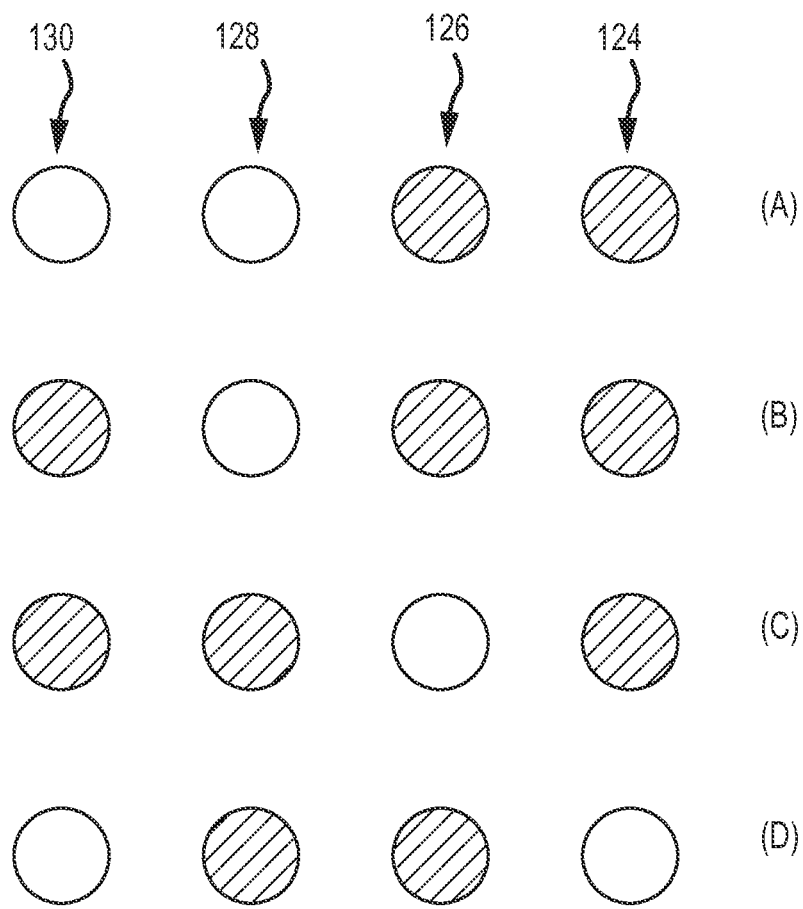
FIG. 4 is a diagram that illustrates exemplary illumination patterns that could be generated during use of the AC outlet tester.

The columns in FIG. 4 represent the four indicator elements: the leftmost column represents the indicator element 130; the second leftmost column represents the indicator element 128; the second rightmost column represents the indicator element 126; and the rightmost column represents the indicator element 124. The rows in FIG. 4 correspond to different possible illumination patterns, which in turn correspond to different possible wiring conditions. The shaded circles in FIG. 4 represent illuminated indicator elements, and the blank circles in FIG. 4 represent inactive indicator elements.

Illumination pattern "A" corresponds to a properly wired electrical outlet. This illumination pattern will be generated to visually indicate a properly wired outlet. As shown in FIG. 4, illumination pattern "A" is generated when the tester 100 deactivates the indicator elements 130, 128 and activates the indicator elements 126, 124. Referring again to FIG. 3, when the outlet is properly wired, there will be a relatively high AC voltage differential (e.g., 120 volts) between the line prong 146 and the ground prong 148 (which activates the indicator element 124), and a relatively high AC voltage differential between the line prong 146 and the neutral prong 144 (which activates the indicator element 126). Moreover, when the outlet is properly wired, there will be little to no voltage differential between the neutral prong 144 and the ground prong 148 (which causes the indicator element 128 to remain off), and there will be little to no voltage differential between the ground prong 148 and the ground point 190 (which causes the indicator element 130 to remain off).

Illumination pattern "B" corresponds to an incorrectly wired electrical outlet having both the ground socket and the neutral socket inadvertently tied to the line voltage conductor, and having the line socket inadvertently tied to the ground voltage conductor (or to the neutral voltage conductor). This example assumes that the ground voltage and neutral voltage conductors have been coupled together such that they represent the same or nearly the same potential. As shown in FIG. 4, illumination pattern "B" is generated when the tester 100 deactivates the indicator element 128, while activating the remaining indicator elements 130, 126, 124. Referring again to FIG. 3, when the outlet is incorrectly wired in this manner, there will be a relatively high AC voltage differential between the ground prong 148 and the ground point 190 (which activates the indicator element 130). There will also be a relatively high AC voltage differential between the line prong 146 and the neutral prong 144 (which activates the indicator element 126), and between the line prong 146 and the ground prong 148 (which activates the indicator element 124). However, there will be little to no voltage differential between the neutral prong 144 and the ground prong 148 (which causes the indicator element 128 to remain off) because both of these prongs are tied to the same conductor in the outlet, namely, the line voltage conductor.

Illumination pattern "C" corresponds to an incorrectly wired electrical outlet wherein the ground socket is inadvertently tied to the line voltage conductor, the line socket is inadvertently tied to the ground voltage conductor, and the neutral socket is correctly tied to the neutral voltage conductor. As shown in FIG. 4, illumination pattern "C" is generated when the tester 100 deactivates the indicator element 126, while activating the remaining indicator elements 130, 128, 124. Referring again to FIG. 3, when the outlet is incorrectly wired in this manner, there will be a relatively high AC voltage differential between the ground prong 148 and the ground point 190 (which activates the indicator element 130). There will also be a relatively high AC voltage differential between the neutral prong 144 and the ground prong 148 due to the incorrectly wired ground socket (this results in activation of the indicator element 128). There will also be a relatively high AC voltage differential between the line prong 146 and the ground prong 148 due to the swapped voltage conductors (this results in activation of the indicator element 124). However, there will be little to no voltage differential between the line prong 146, which is mistakenly coupled to the ground voltage conductor, and the neutral prong 144, which is correctly coupled to the neutral voltage conductor (this causes the indicator element 126 to remain off).

Illumination pattern "D" corresponds to an incorrectly wired electrical outlet wherein the neutral socket is inadvertently tied to the line voltage conductor, the line socket is inadvertently tied to the neutral voltage conductor, and the ground socket is correctly tied to the ground voltage conductor. As shown in FIG. 4, illumination pattern "D" is generated when the tester 100 deactivates the indicator elements 130, 124, while activating the indicator elements 128, 126. Referring again to FIG. 3, when the outlet is incorrectly wired in this manner, there will be little to no voltage differential across the indicator element 130 because the ground prong 148 will be at or near the same potential as the ground point 190. However, there will be a relatively high AC voltage differential between the neutral prong 144 and the ground prong 148 because the neutral socket of the outlet is mistakenly tied to the line voltage conductor (this results in activation of the indicator element 128). There will also be a relatively high AC voltage differential between the line prong 146 and the neutral prong 144 due to the swapped voltage conductors (this results in activation of the indicator element 126). On the other hand, there will be little to no voltage differential between the line prong 146, which is mistakenly coupled to the neutral voltage conductor, and the ground prong 148, which is correctly coupled to the ground voltage conductor (this causes the indicator element 124 to remain off).

It should be appreciated that the tester 100 is also suitably configured to generate other illumination patterns that correspond to other connection scenarios, such as open or floating terminals. Those skilled in the art will be able to determine the various illumination patterns corresponding to all possible outlet wiring conditions, using the same approach utilized above for the illumination patterns shown in FIG. 4.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A testing apparatus compatible with an electrical outlet having a line socket designated for a line voltage conductor, a neutral socket designated for a neutral voltage conductor, and a ground socket designated for a ground voltage conductor, the testing apparatus comprising:

a housing;

a plug interface comprising an electrically conductive line prong extending from the housing and configured to mate with the line socket, an electrically conductive neutral prong extending from the housing and configured to mate with the neutral socket, and an electrically conductive ground prong extending from the housing and configured to mate with the ground socket;

a first voltage controlled indicator lamp having a first terminal connected to a first terminal of a first resistor, and having a second terminal connected to a first electrical node, the first resistor having a second terminal connected to a second electrical node, and the ground prong connected to the second electrical node;

a second voltage controlled indicator lamp having a first terminal connected to a first terminal of a second resistor, and having a second terminal connected to the second electrical node, the second resistor having a second terminal connected to a third electrical node, and the line prong connected to the third electrical node;

a third voltage controlled indicator lamp having a first terminal connected to a first terminal of a third resistor, and having a second terminal connected to the third electrical node, the third resistor having a second terminal connected to a fourth electrical node, and the neutral prong connected to the fourth electrical node;

a fourth voltage controlled indicator lamp having a first terminal connected to a first terminal of a fourth resistor, and having a second terminal connected to the second electrical node, the fourth resistor having a second terminal connected to the fourth electrical node; and a grounding lead extending from the housing, the grounding lead having a proximal end connected to the first electrical node and connected to the second terminal of the first voltage controlled indicator lamp, and having a distal end terminated with an electrically conductive connector; wherein:

the testing apparatus is configured to indicate a properly wired electrical outlet when the plug interface is mated with the properly wired electrical outlet, and when the first voltage controlled indicator lamp is deactivated, the second voltage controlled indicator lamp is activated, the third voltage controlled indicator lamp is activated, and the fourth voltage controlled indicator lamp is deactivated;

the testing apparatus is configured to indicate an incorrectly wired electrical outlet of a first type when the plug interface is mated with the incorrectly wired electrical outlet of the first type, and when the first voltage controlled indicator lamp is activated, the second voltage controlled indicator lamp is activated, the third voltage controlled indicator lamp is activated, and the fourth voltage controlled indicator lamp is deactivated, where the incorrectly wired electrical outlet of the first type has its ground socket and neutral socket tied to the line voltage conductor, and has its line socket tied to the ground voltage conductor or to the neutral voltage conductor;

the testing apparatus is configured to indicate an incorrectly wired electrical outlet of a second type when the plug interface is mated with the incorrectly wired electrical outlet of the second type, and when the first voltage controlled indicator lamp is activated, the second voltage controlled indicator lamp is activated, the third voltage controlled indicator lamp is deactivated, and the fourth voltage controlled indicator lamp is activated, where the incorrectly wired electrical outlet of the second type has its ground socket tied to the line voltage conductor, has its line socket tied to the ground voltage conductor, and has its neutral socket tied to the neutral voltage conductor; and the testing apparatus is configured to indicate an incorrectly wired electrical outlet of a third type when the plug interface is mated with the incorrectly wired electrical outlet of the third type, and when the first voltage controlled indicator lamp is deactivated, the second voltage controlled indicator lamp is deactivated, the third voltage controlled indicator lamp is activated, and the fourth voltage controlled indicator lamp is activated, where the incorrectly wired electrical outlet of the third type has its neutral socket tied to the line voltage conductor, has its line socket tied to the neutral voltage conductor, and has its ground socket tied to the ground voltage conductor.

2. The testing apparatus of claim 1, wherein the grounding lead comprises an insulated wire.

3. The testing apparatus of claim 1, wherein the first voltage controlled indicator lamp is illuminated in response to a voltage differential between the ground prong and the grounding lead.

4. The testing apparatus of claim 1, wherein the grounding lead is removable from the housing.

5. The testing apparatus of claim 1, wherein the electrically conductive connector comprises an electrically conductive clamp.

* * * * *